(12) United States Patent
Morita et al.

(10) Patent No.: US 7,525,846 B2
(45) Date of Patent: Apr. 28, 2009

(54) MEMORY DEVICE

(75) Inventors: Keizo Morita, Kawasaki (JP); Shoichiro Kawashima, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 219 days.

(21) Appl. No.: 11/485,553

(22) Filed: Jul. 13, 2006

(65) Prior Publication Data

US 2007/0217250 A1    Sep. 20, 2007

(30) Foreign Application Priority Data

Mar. 20, 2006   (JP) .............................. 2006-077561

(51) Int. Cl.
*G11C 11/03*   (2006.01)
(52) U.S. Cl. ............... 365/185.26; 365/145; 365/185.2; 365/230.03
(58) Field of Classification Search ............ 365/185.25, 365/145, 230.03, 185.2, 185.26
See application file for complete search history.

(56) References Cited

U.S. PATENT DOCUMENTS 6,128,213 A * 10/2000 Kang ..................... 365/145
6,580,649 B2 * 6/2003 Park ....................... 365/189.07
6,581,832 B1   6/2003 Kato
6,903,973 B2 * 6/2005 Suzuki et al. ............. 365/185.2
7,227,769 B2 * 6/2007 Fukushi et al. ............. 365/145

FOREIGN PATENT DOCUMENTS

| JP | 2002-133857 | 5/2002 |
| JP | 2005-293818 A | 10/2005 |
| KR | 1999-13853 | 2/1999 |

OTHER PUBLICATIONS

Shoichiro Kawashima et al; Bitline GND Sensing Technique for Low-Voltage Operation FeRam; *IEEE Journal of Solid-State Circuits*; vol. 37; No. 5; pp. 592-597; May 2002.
Korean Office Action from Corresponding Korean Patent Application No. 10-2006-0057712.

* cited by examiner

*Primary Examiner*—Pho M. Luu
(74) *Attorney, Agent, or Firm*—Fujitsu Patent Center (57) ABSTRACT

A memory device includes a memory cell having a capacitor for accumulating electric charges in accordance with the logic of data, a bit line connected to the memory cell, a charge transfer circuit for transferring the electric charges in the bit line to an output node, a dummy memory cell connected to the bit line, and a control circuit for controlling the charge transfer ability of the charge transfer circuit in accordance with the change in the voltage of the bit line.

18 Claims, 9 Drawing Sheets

MEMORY DEVICE

CROSS-REFERENCE TO RELATED APPLICATIONS

This application is based upon and claims the benefit of priority from the prior Japanese Patent Application No. 2006-077561, filed on Mar. 20, 2006, the entire contents of which are incorporated herein by reference.

BACKGROUND OF THE INVENTION

1. Field of the Invention

The present invention relates to a memory device.

2. Description of the Related Art

Recently, a readout system of a ferroelectric memory called a bit line GND sense system has been proposed (for example, refer to patent document 1 and non-patent document 1). In the readout system of this kind, in order to prevent the voltage of a bit line from varying when a voltage is applied to a plate line, electric charges to be read out from a memory cell to the bit line are transferred to a charge accumulation circuit via a charge transfer circuit called a charge transfer formed in a pre-sense amplifier, and the logic value of the data stored in the memory cell is judged in accordance with the amount of electric charges transferred to the charge accumulation circuit. The charge transfer is configured by a p channel MOS transistor. In the p channel MOS transistor, the voltage between gate and source is initially set to the same value as that of a threshold voltage before the plate line is activated. The gate of the p channel MOS transistor is controlled by an inverter amplifier that lowers the output voltage in accordance with a rise in the voltage of the bit line.

[Patent document 1] Japanese Patent Application Laid-open No. 2002-133857

[Non-patent document 1] IEEE Journal of Solid-State Circuits, Vol. 37, No. 5 pp592-597, May 2002

In the bit line GND sense system, the readout operation is performed in such a way that a control circuit causes electric charges to flow by opening the gate of the charge transfer circuit with a slight rise of the bit line and the bit line returns to the ground again.

The memory judges the difference between an increase in potential due to electric charges that come out when data "1" is read (P term) and an increase in potential due to electric charges that come out when data "0" is read (U term) by amplifying it with a sense amplifier. However, miniaturization advances and a cell is reduced in size, not only the amount of polarized electric charges Qsw(P-U) but also the respective amounts of P term and U term become smaller, therefore, the ratio in which electric charges are absorbed in a parasitic capacity in the circuit increases and the peak to which the bit line rises is reduced considerably. Due to this, the control circuit is put into a state in which it does not open the charge transfer circuit sufficiently and there arises a problem of decrease in readout margin.

SUMMARY OF THE INVENTION

An object of the present invention is to prevent the readout margin from reducing when data written into the memory cell is read out.

According to an aspect of the present invention, there is provided a memory device including a memory cell having a capacitor for accumulating electric charges in accordance with the logic of data, a bit line connected to the memory cell, a charge transfer circuit for transferring the electric charges of the bit line to an output node, a dummy memory cell connected to the bit line, and a control circuit for controlling the charge transfer ability of the charge transfer circuit in accordance with the change in the voltage of the bit line.

According to another aspect of the present invention, there is provided a memory device including a memory cell having a capacitor for accumulating electric charges in accordance with the logic of data, a bit line connected to the memory cell, a charge transfer circuit for transferring the electric charges of the bit line to an output node, a current supply circuit for supplying a current to the output node from the ground voltage, and a control circuit for controlling the charge transfer ability of the charge transfer circuit in accordance with the change the in voltage of the bit line.

DETAILED DESCRIPTION OF THE PREFERRED EMBODIMENTS

Embodiments of the present invention will be explained below with reference to drawings.

First Embodiment

Figure 1:
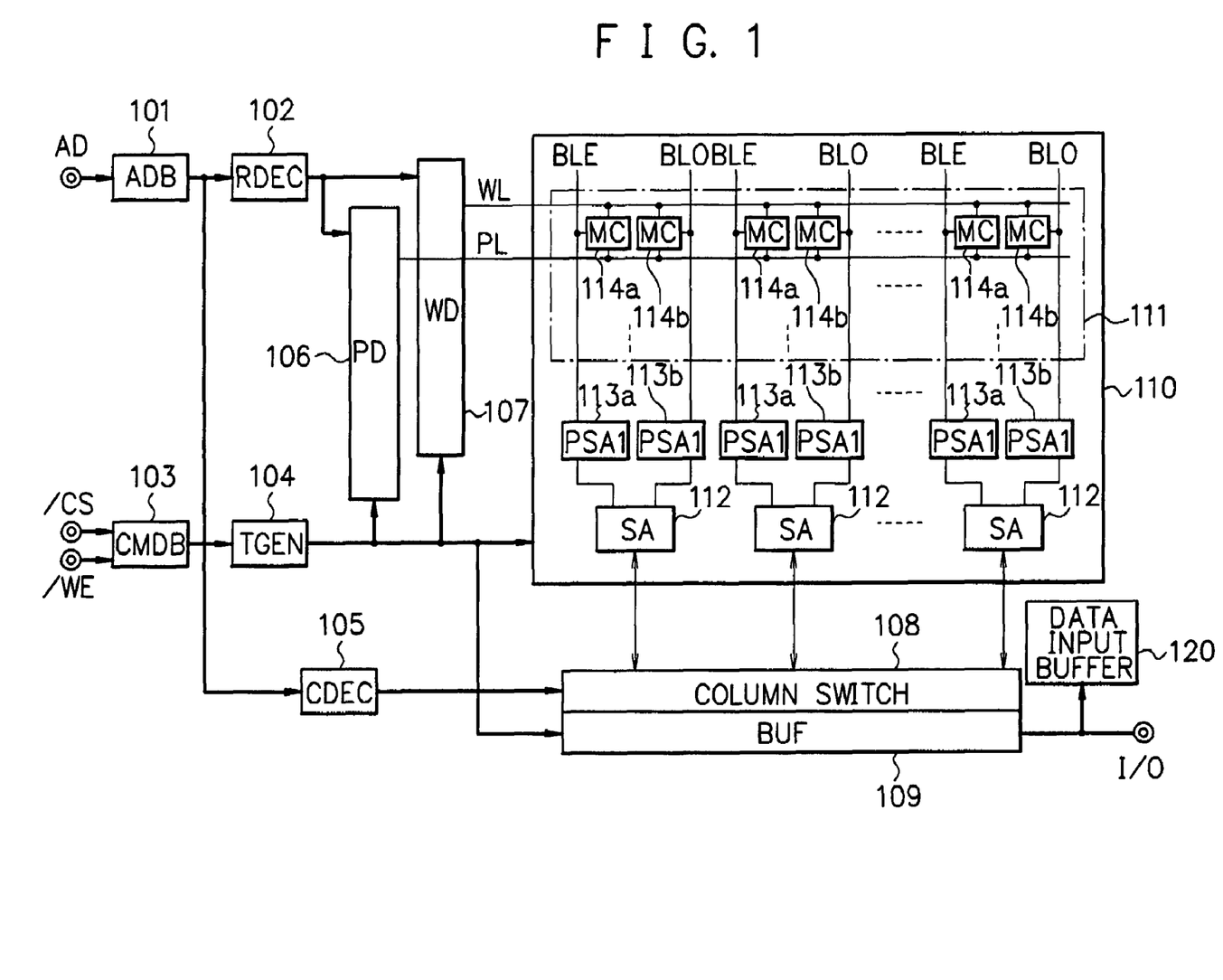
FIG. 1 is a block diagram showing a semiconductor memory according to a first embodiment of the present invention.

FIG. 1 is a block diagram showing a configuration example of a semiconductor memory device according to a first embodiment of the present invention. The semiconductor memory device is formed as a ferroelectric memory using a CMOS process on a silicon substrate.

The ferroelectric memory has an address buffer (ADB) 101, a command buffer (CMDB) 103, a row decoder (RDEC) 102, a timing generation circuit (TGEN) 104, a column decoder (CDEC) 105, a plate driver (PD) 106, a word driver (WD) 107, a memory core 110, a data output buffer (BUF) 109, a column switch 108, and a data input buffer 120.

In FIG. 1, circuits required for readout operation are described mainly. Because of this, circuits such as a write amplifier in addition to the data input buffer 120 required for readout operation are omitted. A data input/output terminal I/O is connected to the data output buffer 109 and the data input buffer 120. The data input buffer 120 inputs data from the data input/output terminal I/O and outputs it to a write circuit.

The address buffer 101 receives an address signal AD via an address terminal and outputs the received signal to the row decoder 102 and the column decoder 105. The row decoder 102 decodes the high order bits (row address) of the address signal AD to generate a row decode signal and outputs the generated signal to the word driver 107 and the plate driver 106.

The column decoder 105 decodes the low order bits (column address) of the address signal AD to generate a column decode signal and outputs the generated signal to the column switch 108.

The command buffer 103 receives a command signal such as a chip select signal/CS and a write enable signal/WE via a command terminal and outputs the received signal to the timing generation circuit 104. The timing generation circuit 104 deciphers the operation mode indicated by the received command signal and outputs a timing signal for operating the plate driver 106, the word driver 107, the data output buffer 109, pre-sense amplifiers 113a and 113b to be described later, etc., in accordance with the decode result.

The plate driver 106 responds to the timing signal from the timing generation circuit 104 and the row decode signal from the row decoder 102 and selects a predetermined plate line PL. The selected plate line PL changes from the low level to the high level during a predetermined period of time.

The word driver 107 responds to the timing signal from the timing generation circuit 104 and the row decode signal from the row decoder 102 and selects a predetermined word line WL. The selected word line WL changes from the low level to the high level during a predetermined period of time.

The memory core 110 has a memory cell array 111, the pre-sense amplifiers (PSA1) 113a and 113b, and a sense amplifier (SA) 112. The pre-sense amplifiers 113a and 113b are bit line ground sense circuits.

The memory cell array 111 has a plurality of sets of memory cells 114a and 114b. The memory cells 114a and 114b are connected to the word line WL and the plate line PL. The memory cell 114a is connected to a bit line BLE and the memory cell 114b is connected to a bit line BLO. The pre-sense amplifier 113a is connected to the bit line BLE and the pre-sense amplifier 113b is connected to the bit line BLO. The sense amplifier 112 is connected to the pre-sense amplifiers 113a and 113b.

Hereinafter, the bit lines BLE and BLO are individually or generally referred to as the bit line BL, the pre-sense amplifiers 113a and 113b are individually or generally referred to as a pre-sense amplifier 113, the memory cells 114a and 114b are individually or generally referred to as a memory cell 114.

The pre-sense amplifier 113 operates when it reads out data from the memory cell 114. The pre-sense amplifier 113 converts electric charges to be read out to the bit line BLE (or BLO) into a voltage and outputs the converted voltage to the sense amplifier 112. The details of the pre-sense amplifier 113 are explained in FIG. 3, FIG. 4, FIG. 5, and FIG. 6 to be described later. The sense amplifier 112 differentially amplifies the respective readout voltages to be outputted from a pair of pre-sense amplifiers 113a and 113b corresponding to the pair of bit lines BLE and BLO, and outputs the amplified data signal to the data output buffer 109 via the column switch 108. The column switch 108 selects, for example, 16 bits from among the output data of the plurality of sense amplifiers 112 in accordance with the column decode signal and causes the data output buffer 109 to store the selected readout data. The data output buffer 109 outputs the data to the data input/output terminal I/O. The data input/output terminal I/O is configured by, for example, 16 bits.

Figure 2:
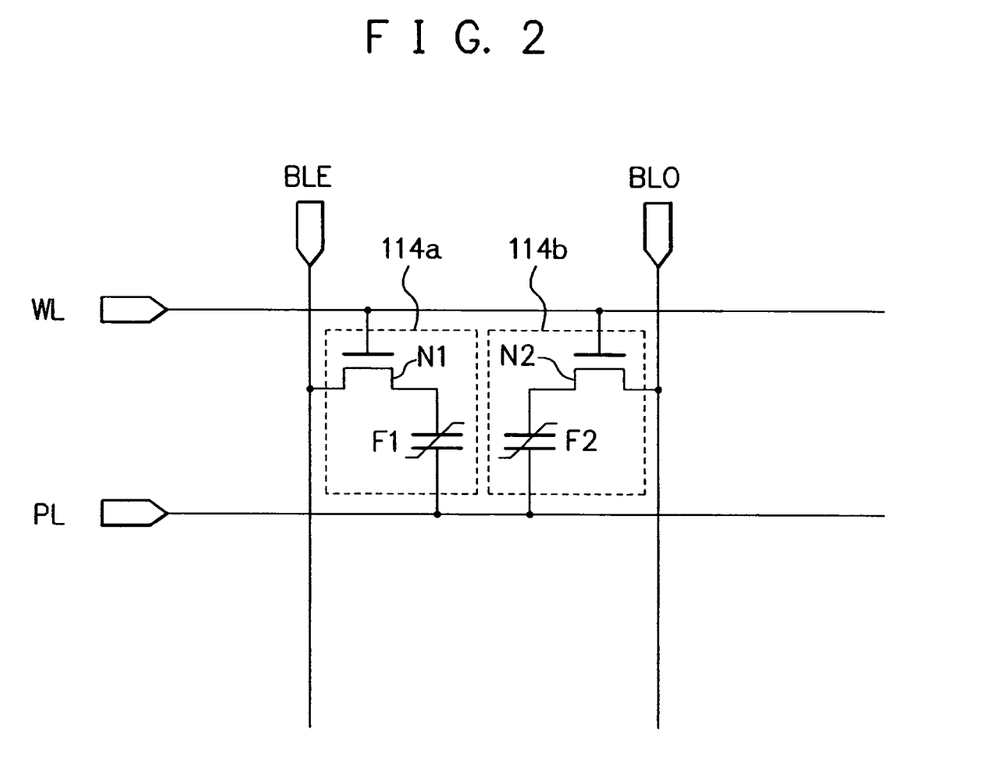
FIG. 2 is a circuit diagram showing details of a memory cell shown in FIG. 1.

FIG. 2 is a circuit diagram showing a configuration example of the memory cells 114a and 114b shown in FIG. 1. The pair of memory cells 114a and 114b is referred to as a 2T2C type in general. The memory cell 114a has an access transistor (access gate) made of an n channel MOS field effect transistor N1 and a ferroelectric capacitor F1. The memory cell 114b has an access transistor (access gate) made of an n channel MOS field effect transistor N2 and a ferroelectric capacitor F2. Hereinafter, the field effect transistor is simply referred to as a transistor.

One end of the ferroelectric capacitor F1 is connected to the bit line BLE via the access transistor N1 and the other end is connected to the plate line PL. One end of the ferroelectric capacitor F2 is connected to the bit line BLO via the access transistor N2 and the other end is connected to the bit line PL. The gates of the access transistors N1 and N2 are connected to the common word line WL. In the ferroelectric capacitors F1 and F2, data inverted with each other (complementary data) is stored.

Figure 3:
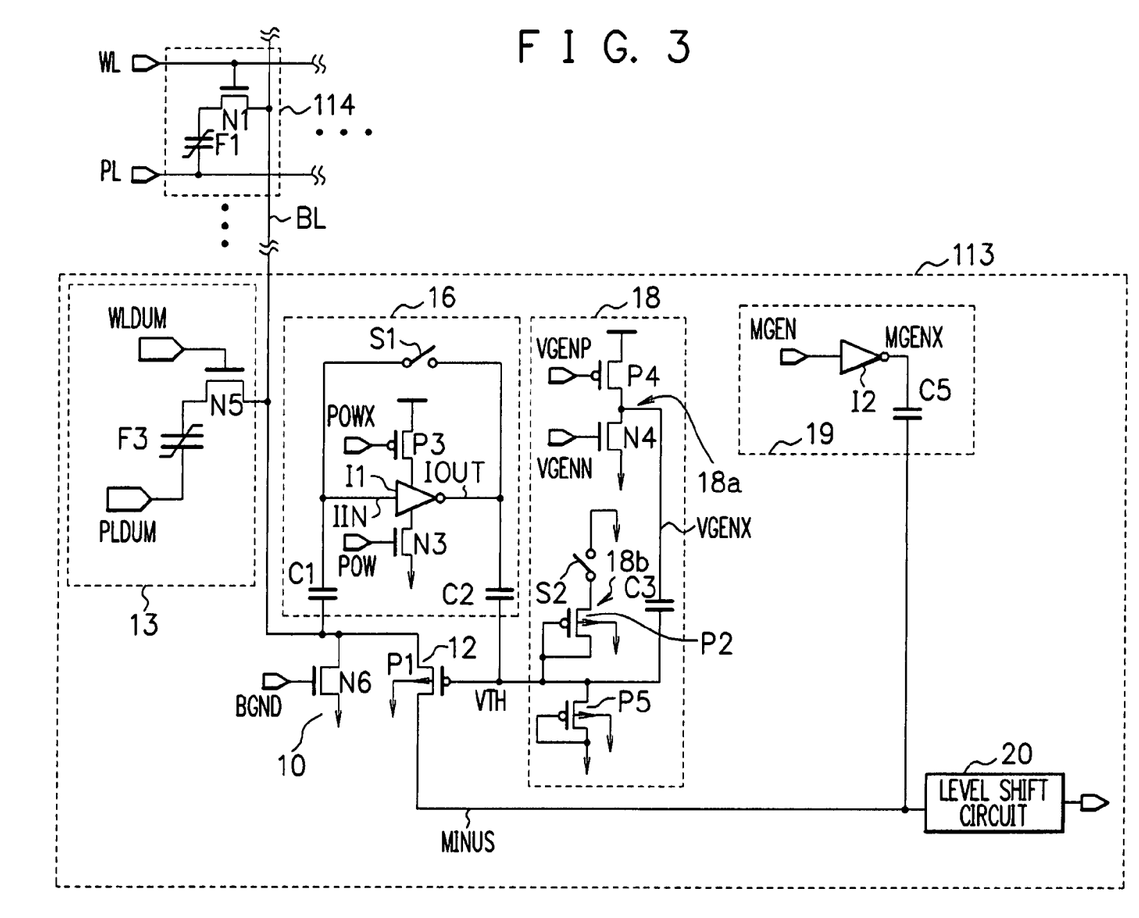
FIG. 3 is a circuit diagram showing details of a pre-sense amplifier shown in FIG. 1.

FIG. 3 is a circuit diagram showing a configuration example of the pre-sense amplifier 113 shown in FIG. 1. The pre-sense amplifiers 113a and 113b have the same configuration. The pre-sense amplifier 113 has a bit line initialization circuit 10, a charge transfer circuit 12, a dummy (pseudo) memory cell 13, an inverter amplifier (control circuit) 16, a threshold voltage generation circuit (initialization circuit) 18, a negative voltage generation circuit (charge accumulation circuit, initialization circuit) 19, and a level shift circuit 20.

The bit line initialization circuit 10 is configured by an n channel transistor N6 the gate of which is connected to the line of a control signal BGND, the source of which is connected to the ground line, and the drain of which is connected to the bit line BL (BLE or BLO).

The charge transfer circuit 12 is configured by a p channel transistor P1 the gate (control terminal) of which is connected to the output node VTH of the threshold voltage generation circuit 18, the source of which is connected to the bit line BL, and the drain of which is connected to the output node MINUS of the negative voltage generation circuit 19.

The dummy memory cell 13 has an n channel transistor N5 and a ferroelectric capacitor F3. The gate of the n channel transistor N5 is connected to the line of a control signal WLDUM, the source is connected to the ferroelectric capacitor F3, and the drain is connected to the bit line BL (BLE or BLO). One of the electrodes of the ferroelectric capacitor F3 is connected to the line of a control signal PLDUM and the other electrode is connected to the source of the n channel transistor N5. For example, the ferroelectric capacitor F3 stores data "0".

The inverter amplifier 16 has a CMOS inverter (feedback inverter) I1, a switch S1 for connecting an output terminal IOUT of the CMOS inverter I1 with an input terminal IIN, a capacitor C1 arranged between the input terminal IIN of the CMOS inverter I1 and the bit line BL, and a capacitor C2 arranged between the output terminal IOUT of the CMOS inverter I1 and the gate of the charge transfer circuit 12. The source of the p channel transistor in the CMOS inverter I1 is connected to the drain of a p channel transistor P3. The gate of the p channel transistor P3 is connected to the line of a power control signal POWX and the source is connected to a power source line VDD. The source of the n channel transistor in the CMOS inverter I1 is connected to the drain of an n channel transistor N3. The gate of the n channel transistor N3 is connected to the line of a power control signal POW, and the source is connected to the ground line. The power control signals POWX and POW change to the low level and to the high level, respectively, when they start readout operation and activate the CMOS inverter I1. In the same manner, the switch S1 is turned off when readout operation is started. The capacitors C1 and C2 are configured by, for example, a ferroelectric capacitor.

The threshold voltage generation circuit 18 has a voltage generation circuit 18a for generating the high level (power source voltage VDD) or the low level (ground voltage) at a node VGENX, a capacitor C3 connected between the node VGENX and the node VTH, a clamp circuit 18b connected to the node VTH, and a switch S2 for connecting the clamp circuit 18b with the ground line. The voltage generation circuit 18a has a p channel transistor P4 and an n channel transistor N4 connected in series between the power source line VDD and the ground line. The gates of the p channel transistor P4 and the n channel transistor N4 input voltage control signals VGENP and VGENN, respectively. The clamp circuit 18b is configured by a p channel transistor P2 the source of which is connected to the ground line via the switch S2 and the gate and the drain of which are connected to the node VTH, and a p channel transistor P5 the gate and drain of which are connected to the ground line and the drain of which is connected to the node VTH. The capacitor C3 is configured by, for example, a ferroelectric capacitor.

The negative voltage generation circuit 19 has a CMOS inverter I2 the input of which is connected to the line of a negative voltage control signal MGEN and the output of which is connected to the node MGENX and a capacitor C5 arranged between the node MGENX and the node MINUS. The capacitor C5 is configured by, for example, a ferroelectric capacitor.

The level shift circuit 20 has a capacitor for shifting in level the negative voltage generated at the node MINUS to a positive voltage, an n channel transistor, and a p channel transistor.

Figure 4:
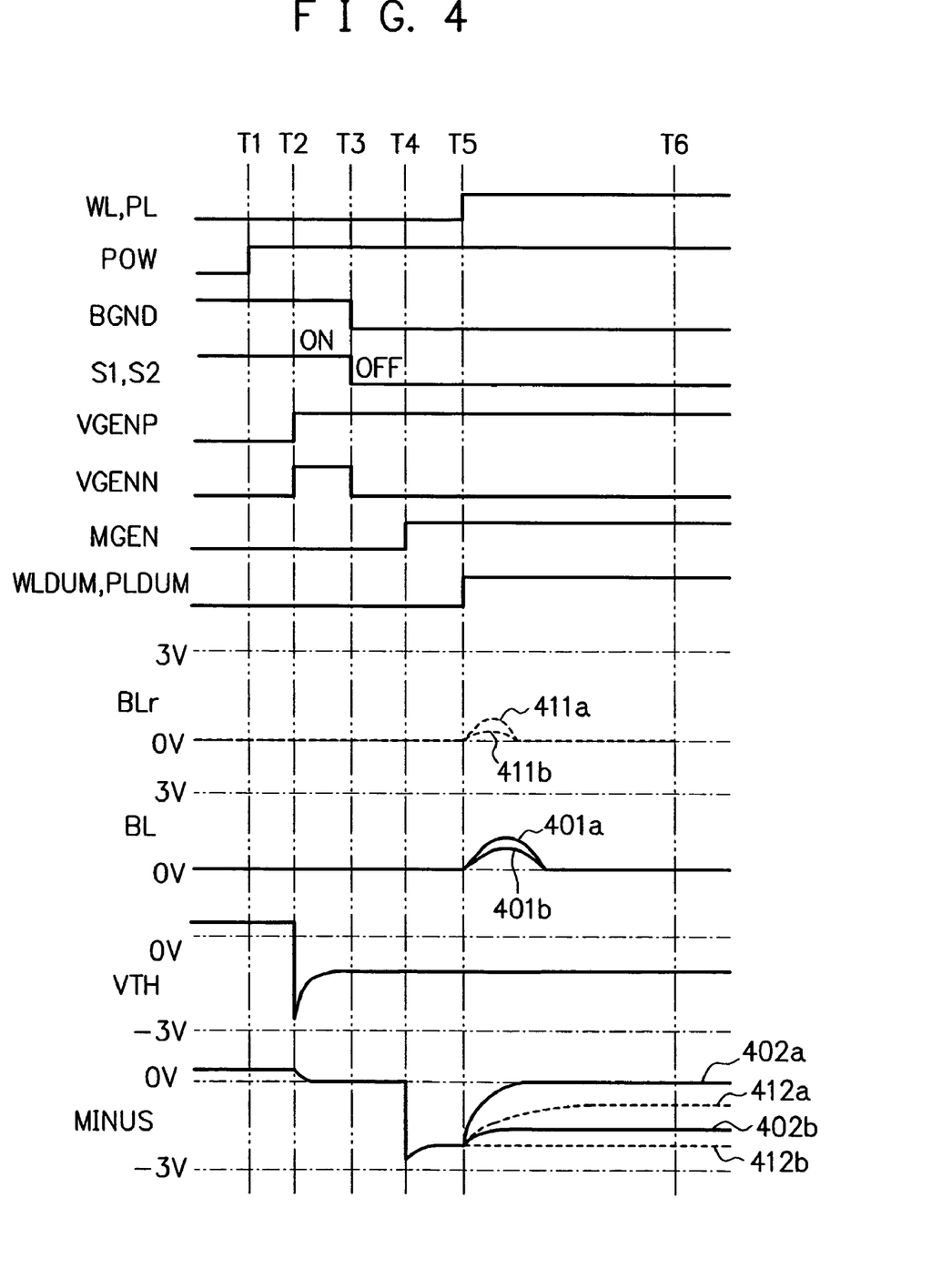
FIG. 4 is a waveform diagram showing a readout operation of a ferroelectric memory in the first embodiment.

FIG. 4 shows readout operation of a ferroelectric memory according to the first embodiment. First, in the initial state, the node MINUS connected to the drain of the p channel transistor (charge transfer circuit) 12 is in a floating state, therefore, its voltage is not determined. However, a pn junction is formed by the source and drain (p type diffusion layer) of the p channel transistor 12 and the back gate (n type diffusion layer, ground voltage), therefore, the voltage of the node MINUS does not rise above the forward voltage (about 0.8 V) of the pn junction.

On the other hand, the node VTH connected to the gate of the p channel transistor (charge transfer circuit) 12 is also in a floating state, therefore, its voltage is not determined. However, due to the p channel transistor P5 arranged in the clamp circuit 18b, the voltage of the node VTH does not rise above the threshold voltage (about 0.6 V) of the p channel transistor.

The voltage control signals VGENP and VGENN, and the negative voltage control signal MGEN are kept at the low level and the nodes VGENX and MGENX are kept at the high level. Since the control signal BGND is kept at the high level, the n channel transistor N6 (bit line initialization circuit 10) turns on and the voltage of the bit line BL (BLE or BLO) is initialized to the ground voltage. The power control signals POW and POWX are kept at the low level and at the high level, respectively, and the feedback inverter (CMOS inverter) I1 is turned off. The switches S1 and S2 are turned on. The control signal for controlling the operation of the switches S1 and S2, the voltage control signals VGENP and VGENN, the negative voltage control signal MGEN, the control signal BGND, and the power control signals POW and POWX are generated by the timing generation circuit 104 shown in FIG. 1.

At time T1, the power control signals POW and POWX change to the high level and to the low level, respectively, and the feedback inverter I1 is activated. Since the switch S1 is turned on, the input voltage IIN and the output voltage IOUT of the feedback inverter I1 are both approximately VDD/2.

At time T2, the voltage control signals VGENP and VGENN change to the high level and the node VGENX changes from the high level to the low level. Due to the capacitive coupling of the capacitor C3, the voltage of the node VTH drops in accordance with the change of the node VGENX to the low level. When the power source voltage VDD is 3 V, if the voltage node VGENX drops by 3 V, the voltage of the VTH also tends to drop by 3 V. However, when the switch S2 turns on, the p channel transistor (clamp circuit) 18b clamps the voltage of the node VTH at the threshold voltage (for example, −0.6 V) of the p channel transistor 18b. Because of this, the voltage of the node VTH draws a differential waveform and settles at a negative voltage (−0.6 V) after rising once. As described above, the threshold voltage generation circuit 18 operates as an initialization circuit for setting the input node VTH of the charge transfer circuit 12 to a predetermined voltage.

The threshold voltage of the p channel transistor 12 is designed so as to be equal to the threshold voltage of the p channel transistor 18b. Therefore, when the voltage of the node VTH drops once, the p channel transistor 12 turns on and the voltage of the node MINUS drops to the voltage (ground voltage) of the bit line BL.

On the other hand, the voltage of the node MGENX is set to the high level (=power source voltage VDD) by the CMOS inverter I2, therefore, the capacitor C5 is charged with electric charges corresponding to the product of the capacitance value and the power source voltage VDD.

At time T3, the voltage control signal VGENN changes to the low level and the n channel transistor N4 of the voltage generation circuit 18a turns off. Since the p channel transistor P4 of the voltage generation circuit 18a has already turned off, the node VGENX enters a floating state. At the same time, the switches S1 and S2 are turned off. By the turning off of the switch S2, the clamp of the node VTH by the p channel transistor 18b is released. By the turning off of the switch S1, the short circuit between the input and output of the feedback inverter I1 is released. The voltage of the input of the feedback inverter I1 is approximately VDD/2, therefore, the feedback inverter I1 operates as an inversion amplifier having a high gain. On the other hand, the control signal BGND also changes to the low level and the bit line BL enters a floating state. Because of the operations described above, after the time T3, when the voltage of the bit line BL rises, the input voltage IIN of the feedback inverter I1 rises due to the capacitive coupling of the capacitor C1. The feedback inverter I1 amplifies the change in the input voltage IIN and lowers the output voltage IOUT in the opposite direction. The voltage of the node VTH drops in accordance with the change in the output voltage IOUT due to the capacitive coupling of the capacitor C2.

At time T4, the negative voltage control signal MGEN changes to the high level and the voltage of the node MGENX changes from the high level to the low level. The voltage of the node MINUS drops in accordance with the drop in the voltage of the node MGENX due to the capacitive coupling of the capacitor C5. When the power source voltage VDD is 3 V, the voltage of the node MGENX drops by 3 V. Since the voltage of the node MINUS is initialized to 0 V, it drops to about −3 V due to the change in the voltage of the node MGENX. However, due to the loss by the parasitic capacitance and the leak current of the p channel transistor 12 already slightly conductive, the voltage of the node MINUS becomes higher than −3 V.

The voltage of the node MINUS is kept at the voltage by the capacitor C5. In this manner, the negative voltage generation circuit 19 operates as an initialization circuit for setting the output node MINUS of the charge transfer circuit 12 to its initial state and the charge transfer ability of the charge transfer circuit 12 to its initial state.

At time T5, the voltages of the word line WL and the plate line PL change from the ground voltage to the power source voltage VDD. By the rise of the word line WL, the access transistor N1 of the memory cell 114 turns on and a positive voltage is applied to the ferroelectric capacitor F1 of the memory cell 114. When the memory cell 114 stores data "1", the polarity of the voltage applied to the ferroelectric capacitor F1 is opposite to that at the time of write, therefore, polarities are reversed and a large amount of reversed electric charges are read out to the bit line BL. In the bit line BL, a voltage 401a with data "1" is generated. When the memory cell 114 stores data "0", the polarity of the voltage applied to the ferroelectric capacitor F1 is the same as that at the time of write, therefore, polarities are not reversed and a comparatively small amount of electric charges are read out to the bit line BL. In the bit line BL, a voltage 401b with data "0" is generated. At this time, the voltage of the bit line BL tends to rise.

However, if the voltage of the bit line BL rises slightly, due to the capacitive coupling of the capacitor C1, the input voltage IIN of the feedback inverter I1 rises. Due to the inversion amplification effect and the capacitive coupling of the capacitor C2, the voltage of the node VTH drops and the voltage (absolute value) between gate and source of the p channel transistor 12 becomes large. Because of this, a drain current occurs in the p channel transistor 12 and the electric charges read out to the bit line BL are transferred from the bit line BL to the node MINUS. Therefore, the rise in the voltage of the bit line BL is suppressed and kept again at about 0 V (ground voltage). In this manner, the feedback inverter I1 operates as a control circuit for adjusting the charge transfer ability of the charge transfer circuit 12. The capacitor C5 is caused to discharge due to the electric charges transferred to the node MINUS, the voltage (readout voltage) of the node MINUS rises. In this manner, the capacitor C5 of the negative voltage generation circuit 19 operates as a readout circuit for generating a readout voltage in accordance with the accumulated electric charges.

In the bit line GND sense system, it is possible to fully apply the power source voltage VDD to the bit line BL without being affected by the capacitance division of the bit line BL and the memory cell 114, however, as described above, the control circuit 16 operates in such a way as to detect a slight rise of the bit line BL at the time of readout operation and open the gate of the charge transfer circuit 12 to cause the electric charges to flow, thereby the bit line BL returns to the ground again. The memory makes judgment by amplifying the difference between the voltage due to the electric charges that come out when data "1" is read out (P term) and the voltage due to the electric charges that come out when data "0" is read out (U term) by the sense amplifier 112. However, miniaturization advances and the memory cell 114 is reduced in size, not only the amount of polarized electric charges Qsw(P−U) but also the respective amounts of P term and U term become smaller, therefore, the ratio in which electric charges are absorbed in a parasitic capacity in the circuit increases and the peak to which the bit line rises is reduced considerably. Due to this, the control circuit 16 is put into a state of being unable to open the charge transfer circuit 12 sufficiently and the readout margin is thus reduced.

The present embodiment is characterized in that the presense amplifier 113 has the dummy memory cell 13. Here, for comparison, the voltage of the bit line BL when the dummy memory cell 13 is not present is denoted by a voltage BLr in the circuit in FIG. 3. At the time T5, the voltages of the word line WL and the plate line PL change from the ground voltage to the power source voltage VDD. When the memory cell 114 stores data "1", the voltage BLr is the voltage 411a. When the memory cell 114 stores data "0", the voltage BLr is the voltage 411b.

In the present embodiment, at the time T5, at the same timing when the voltages of the word line WL and the plate line PL change from the ground voltage to the power source voltage VDD, the voltages of the word line WLDUM and the plate line PLDUM of the dummy memory cell 13 change from the ground voltage to the power source voltage VDD. Since the voltage of the bit line BL is the ground voltage, the electric charges that come out when data "0" is read out (U term) flow to the bit line BL in the dummy memory cell 13. Because of this, the voltage of the bit line BL rises above the voltage BLr when the dummy memory cell 13 is not present. Therefore, it is made possible for the control circuit 16 to open the charge transfer circuit 12 sufficiently.

In the present embodiment, the node MINUS is at a voltage 402a when the memory cell 114 stores data "1" and at a voltage 402b when the memory cell 114 stores data "0". It is made possible to adjust the voltage 402a of the node MINUS so as to rise to the ground voltage when data "1" is read out. In contrast to this, when the dummy memory cell 13 is not present, the node MINUS is at a voltage 412a when the memory cell 114 stores data "1" and at a voltage 412b when the memory cell 114 stores data "0". In the present embodiment, it is possible to raise the voltage of the node MINUS at the time of readout compared to the case where the dummy memory cell 13 is not present.

Figure 5:
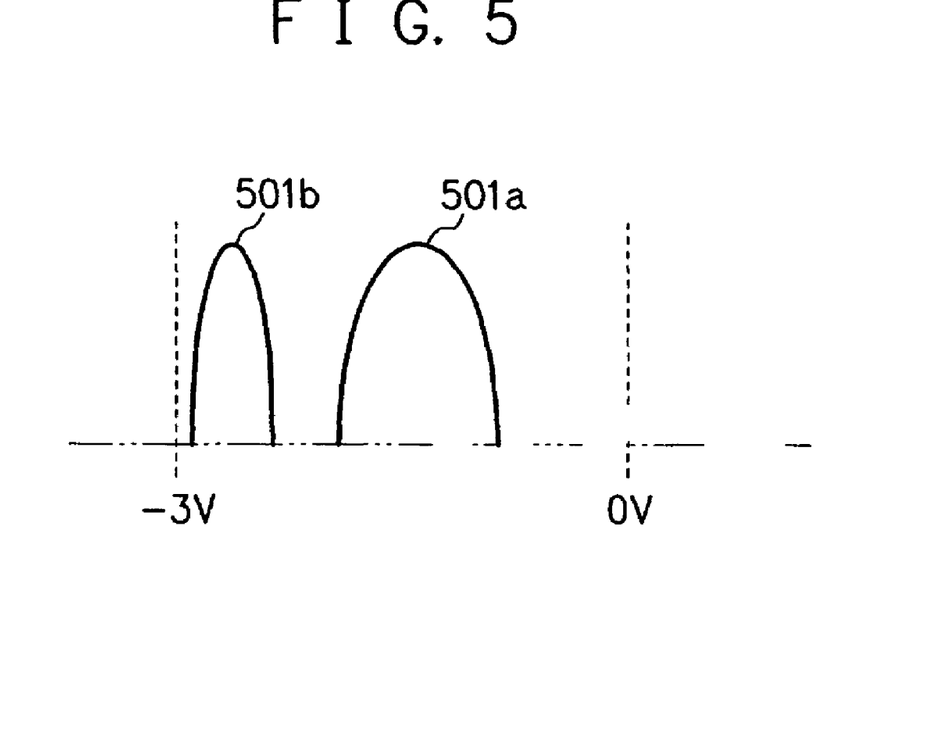
FIG. 5 is a diagram showing a cell distribution.

FIG. 5 is a voltage distribution diagram of the node MINUS when the dummy memory cell 13 is not present. A distribution 501a shows a distribution when data "1" is read out from the memory cell 114. A distribution 501b shows a distribution when data "0" is read out from the memory cell 114. Because of the variations in the characteristics of the ferroelectric capacitors F1 and F2, variations occur in the voltage of the node MINUS when data is read out from the memory cell 114. The variations cause erroneous operations of the memory device and are the main factor that reduces the yield. Generally, the degree of variations is large in the distribution 501a when data "1" is read out from the memory cell 114 (P term) than in the distribution 501b when data "0" is read out (U term).

Figure 6:
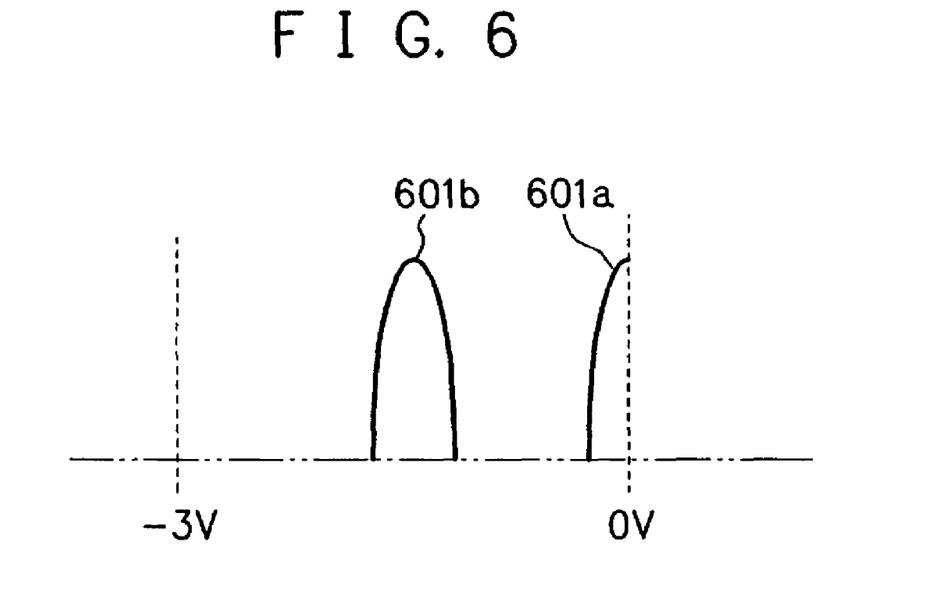
FIG. 6 is a diagram showing a cell distribution according to the first embodiment.

FIG. 6 is a voltage distribution diagram of the node MINUS in the present embodiment. A distribution 601a shows a distribution when data "1" is read out from the memory cell 114. A distribution 601b shows a distribution when data "0" is read out from the memory cell 114. In the present embodiment, it is possible to raise the voltage of the bit line BL by providing the dummy memory cell 13. Because of this, in the present embodiment, compared to the case of FIG. 5, it is possible to move in the direction in which the voltage distribution of the node MINUS becomes higher. If the voltage 402a of the node MINUS when data "1" is read out (P term) is adjusted so that it rises to the ground voltage, as shown in FIG. 4, the variations of the distribution 601a of P term are suppressed apparently, the distribution 601a becomes steeper, and the sense margin can be widened.

At time T6 in FIG. 4, the readout voltage (negative voltage) of the node MINUS is differentially amplified by the sense amplifier 112 shown in FIG. 1 after the level thereof is shifted to a positive voltage by the level shift circuit 20 shown in FIG. 3. Then, the logic value of the data stored in the memory cell 114 is read out. After this, like the case of a general ferroelectric memory, a restore operation is performed by which the polarized state of the memory cell 114 polarized and reversed by the read operation is returned to the original state.

Second Embodiment

Figure 7:
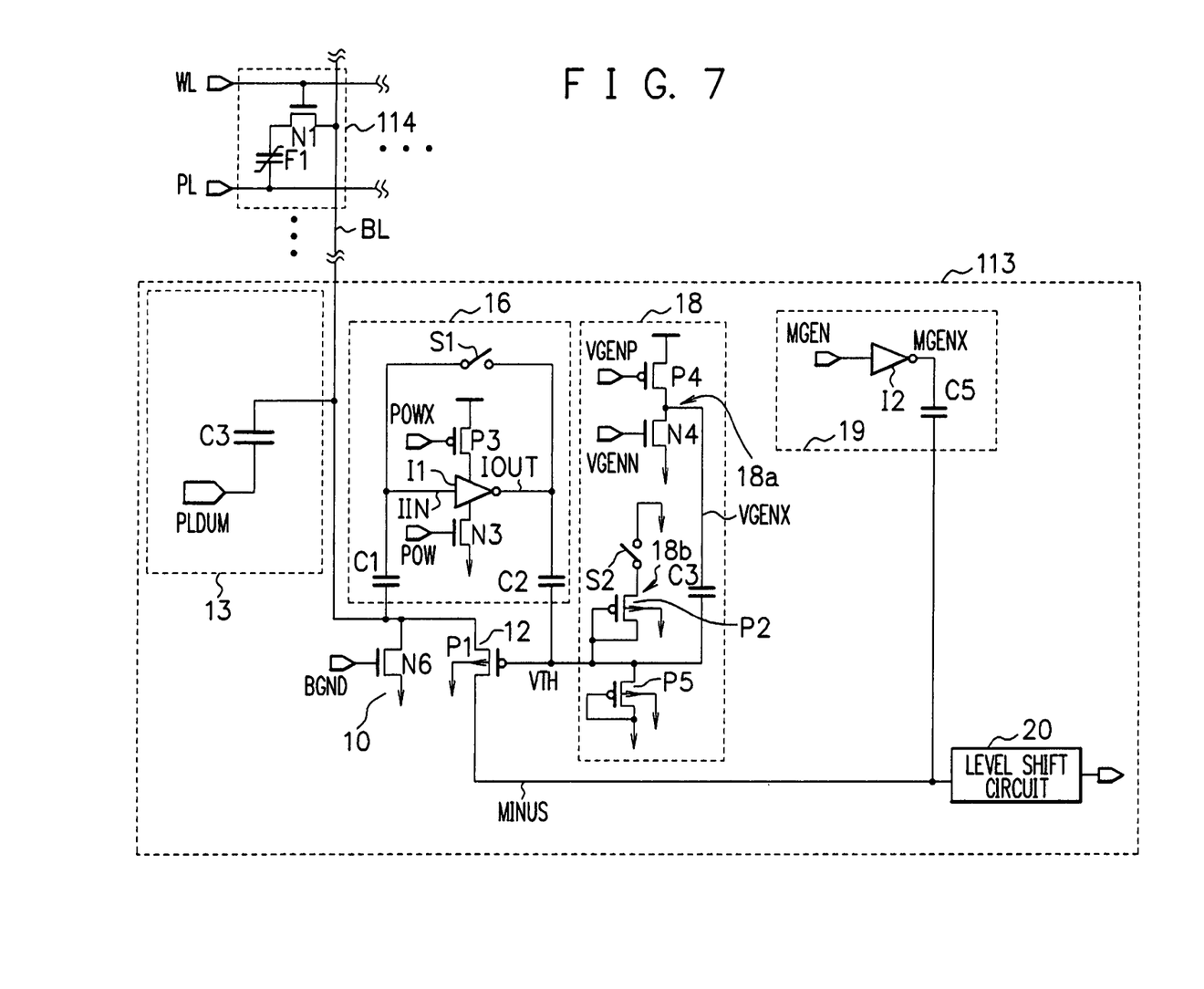
FIG. 7 is a circuit diagram showing details of a pre-amplifier of a semiconductor memory according to a second embodiment of the present invention.

FIG. 7 shows a configuration example of a semiconductor memory device according to a second embodiment of the present invention. The configuration is the same as that in the first embodiment except in the circuit of the pre-sense amplifier 113. In particular, in the present embodiment, the configuration of the dummy memory cell amplifier 13 is different from that in the first embodiment (FIG. 3).

The pre-sense amplifier 113 has the bit line initialization circuit 10, the charge transfer circuit 12, the dummy memory cell 13, the inverter amplifier (control circuit) 16, the threshold voltage generation circuit (initialization circuit) 18, the negative voltage generation circuit (charge accumulation circuit, initialization circuit) 19, and the level shift circuit 20.

The dummy memory cell 13 is configured by a capacitor C4 connected between the line of the control signal PLDUM and the bit line BL. It is not necessary for the capacitor C4 to be a ferroelectric capacitor in particular. The rest is the same as that of the pre-sense amplifier 113 in the first embodiment.

Figure 8:
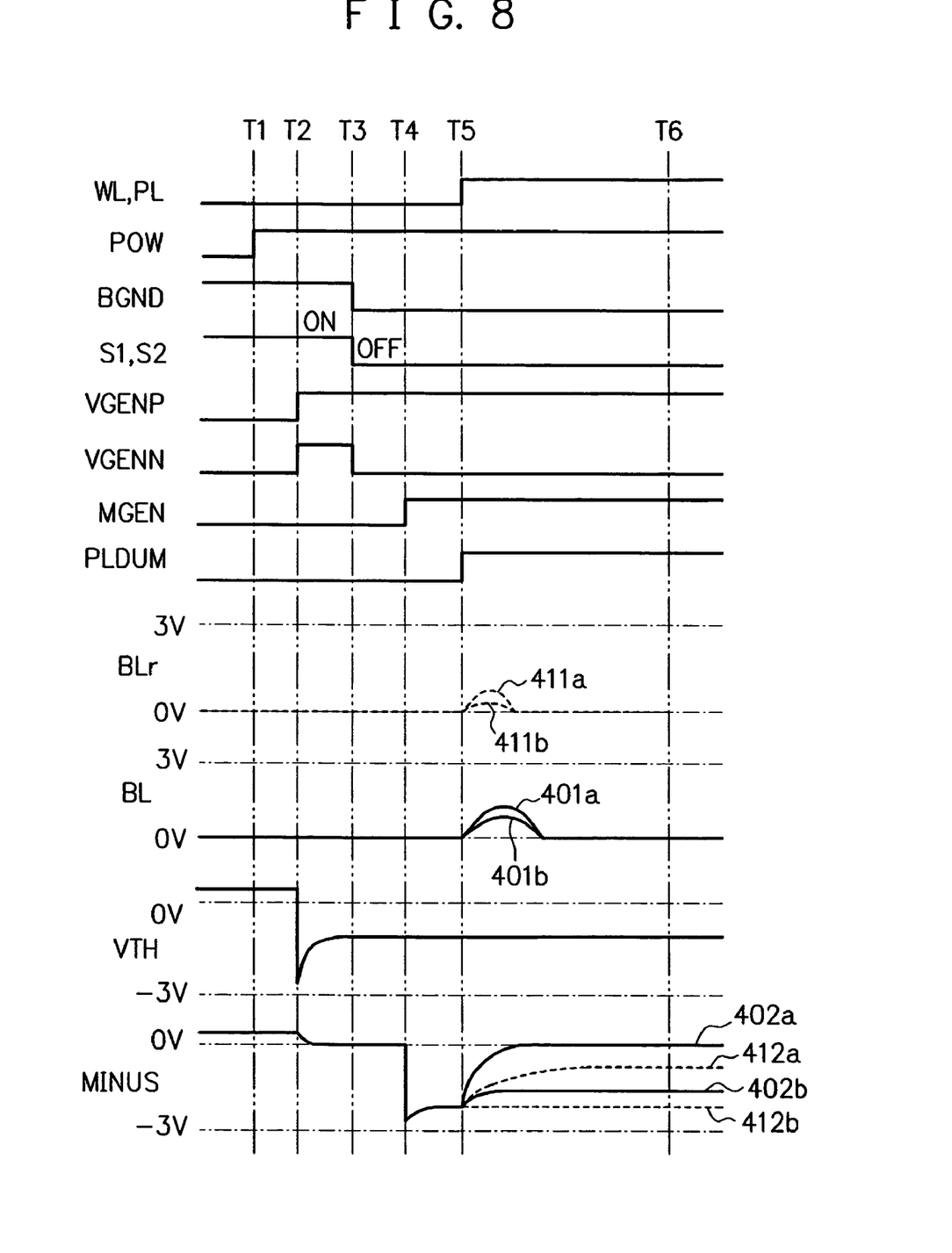
FIG. 8 is a waveform diagram showing a readout operation of a ferroelectric memory in the second embodiment.

FIG. 8 shows readout operation of a ferroelectric memory according to the second embodiment. First, in the initial state, the node MINUS connected to the drain of the p channel transistor (charge transfer circuit) 12 is in a floating state, therefore, its voltage is not determined. However, a pn junction is formed by the source and drain (p type diffusion layer) of the p channel transistor 12 and the back gate (n type diffusion layer, ground voltage), therefore, the voltage of the node MINUS does not rise above the forward voltage (about 0.8 V) of the pn junction. On the other hand, the node VTH connected to the gate of the p channel transistor (charge transfer circuit) 12 is also in a floating state, therefore, its voltage is not determined. However, due to the p channel transistor P5 arranged in the clamp circuit 18b, the voltage of the node VTH does not rise above the threshold voltage (about 0.6 V) of the p channel transistor.

The voltage control signals VGENP and VGENN, and the negative voltage control signal MGEN are kept at the low level and the nodes VGENX and MGENX are kept at the high level. Since the control signal BGND is kept at the high level, the n channel transistor N6 (bit line initialization circuit 10) turns on and the voltage of the bit line BL (BLE or BLO) is initialized to the ground voltage. The power control signals POW and POWX are kept at the low level and at the high level, respectively, and the feedback inverter (CMOS inverter) I1 is turned off. The switches S1 and S2 are turned on. The control signal for controlling the operation of the switches S1 and S2, the voltage control signals VGENP and VGENN, the negative voltage control signal MGEN, the control signal BGND, and the power control signals POW and POWX are generated by the timing generation circuit 104 shown in FIG. 1.

At the time T1, the power control signals POW and POWX change to the high level and to the low level, respectively, and the feedback inverter I1 is activated. Since the switch S1 is turned on, the input voltage IIN and the output voltage IOUT of the feedback inverter I1 are both approximately VDD/2.

At the time T2, the voltage control signals VGENP and VGENN change to the high level and the node VGENX changes from the high level to the low level. Due to the capacitive coupling of the capacitor C3, the voltage of the node VTH drops in accordance with the change of the node VGENX to the low level. When the power source voltage VDD is 3 V, if the voltage node VGENX drops by 3 V, the voltage of the VTH also tends to drop by 3 V. However, when the switch S2 turns on, the p channel transistor (clamp circuit) 18b clamps the voltage of the node VTH at the threshold voltage (for example, −0.6 V) of the p channel transistor 18b. Because of this, the voltage of the node VTH draws a differential waveform and settles at a negative voltage (−0.6 V) after rising once. As described above, the threshold voltage generation circuit 18 operates as an initialization circuit for setting the input node VTH of the charge transfer circuit 12 to a predetermined voltage.

The threshold voltage of the p channel transistor 12 is designed so as to be equal to the threshold voltage of the p channel transistor 18b. Therefore, when the voltage of the node VTH drops once, the p channel transistor 12 turns on and the voltage of the node MINUS drops to the voltage (ground voltage) of the bit line BL.

On the other hand, the voltage of the node MGENX is set to the high level (=power source voltage VDD) by the CMOS inverter 12, therefore, the capacitor C5 is charged with electric charges corresponding to the product of the capacitance value and the power source voltage VDD.

At the time T3, the voltage control signal VGENN changes to the low level and the n channel transistor N4 of the voltage generation circuit 18a turns off. Since the p channel transistor P4 of the voltage generation circuit 18a has already turned off, the node VGENX enters a floating state. At the same time, the switches S1 and S2 are turned off. By the turning off of the switch S2, the clamp of the node VTH by the p channel transistor 18b is released. By the turning off of the switch S1, the short circuit between the input and output of the feedback inverter I1 is released. The voltage of the input of the feedback inverter I1 is approximately VDD/2, therefore, the feedback inverter I1 operates as an inversion amplifier having a high gain. On the other hand, the control signal BGND also changes to the low level and the bit line BL enters a floating state. Because of the operations described above, after the time T3, when the voltage of the bit line BL rises, the input voltage IIN of the feedback inverter I1 rises due to the capacitive coupling of the capacitor C1. The feedback inverter I1 amplifies the change in the input voltage IIN and lowers the output voltage IOUT in the opposite direction. The voltage of the node VTH drops in accordance with the change in the output voltage IOUT due to the capacitive coupling of the capacitor C2.

At the time T4, the negative voltage control signal MGEN changes to the high level and the voltage of the node MGENX changes from the high level to the low level. The voltage of the node MINUS drops in accordance with the drop in the voltage of the node MGENX due to the capacitive coupling of the capacitor C5. When the power source voltage VDD is 3 V, the voltage of the node MGENX drops by 3 V. Since the voltage of the node MINUS is initialized to 0 V, it drops to about −3 V due to the change in the voltage of the node MGENX. However, due to the loss by the parasitic capacitance and the leak current of the p channel transistor 12 already slightly conductive, the voltage of the node MINUS becomes higher than −3 V.

The voltage of the node MINUS is kept at the voltage by the capacitor C5. In this manner, the negative voltage generation circuit 19 operates as an initialization circuit for setting the output node MINUS of the charge transfer circuit 12 to its initial state and the charge transfer ability of the charge transfer circuit 12 to its initial state.

At the time T5, the voltages of the word line WL and the plate line PL change from the ground voltage to the power source voltage VDD. By the rise of the word line WL, the access transistor N1 of the memory cell 114 turns on and a positive voltage is applied to the ferroelectric capacitor F1 of the memory cell 114. When the memory cell 114 stores data "1", the polarity of the voltage applied to the ferroelectric capacitor F1 is opposite to that at the time of write, therefore, polarities are reversed and a large amount of reversed electric charges are read out to the bit line BL. In the bit line BL, the voltage 401a with data "1" is generated. When the memory cell 114 stores data "0", the polarity of the voltage applied to the ferroelectric capacitor F1 is the same as that at the time of write, therefore, polarities are not reversed and a comparatively small amount of electric charges are read out to the bit line BL. In the bit line BL, the voltage 401b with data "0" is generated. At this time, the voltage of the bit line BL tends to rise.

However, if the voltage of the bit line BL rises slightly, due to the capacitive coupling of the capacitor C1, the input voltage IIN of the feedback inverter I1 rises. Due to the inversion amplification effect and the capacitive coupling of the capacitor C2, the voltage of the node VTH drops and the voltage (absolute value) between gate and source of the p channel transistor 12 becomes large. Because of this, a drain current occurs in the p channel transistor 12 and the electric charges read out to the bit line BL are transferred from the bit line BL to the node MINUS. Therefore, the rise in the voltage of the bit line BL is suppressed and kept again at about 0 V (ground voltage). In this manner, the feedback inverter I1 operates as a control circuit for adjusting the charge transfer ability of the charge transfer circuit 12. The capacitor C5 is caused to discharge due to the electric charges transferred to the node MINUS, the voltage (readout voltage) of the node MINUS rises. In this manner, the capacitor C5 of the negative voltage generation circuit 19 operates as a readout circuit for generating a readout voltage in accordance with the accumulated electric charges.

In the bit line GND sense system, it is possible to fully apply the power source voltage VDD to the bit line BL without being affected by the capacitance division of the bit line BL and the memory cell 114, however, as described above, the control circuit 16 operates in such a way as to detect a slight rise of the bit line BL at the time of readout operation and open the gate of the charge transfer circuit 12 to cause the electric charges to flow, thereby the bit line BL returns to the ground again. The memory makes judgment by amplifying the difference between the voltage due to the electric charges that come out when data "1" is read out (P term) and the voltage due to the electric charges that come out when data "0" is read out (U term) by the sense amplifier 112. However, miniaturization advances and the memory cell 114 is reduced in size, not only the amount of polarized electric charges Qsw(P−U) but also the respective amounts of P term and U term become smaller, therefore, the ratio in which electric charges are absorbed in a parasitic capacity in the circuit increases and the peak to which the bit line rises is reduced considerably. Due to this, the control circuit 16 is put into a state of being unable to open the charge transfer circuit 12 sufficiently and the readout margin is thus reduced.

The voltage BLr is the same as that in the case of FIG. 4. In the second embodiment of the present invention, at the time T5, at the same timing when the voltages of the word line WL and the plate line PL change from the ground voltage to the power source voltage VDD, the voltage of the plate line PLDUM of the dummy memory cell 13 changes from the ground voltage to the power source voltage VDD. Because of this, by the influence of the capacitive coupling of the capacitor C4, the voltage of the bit line BL rises above the voltage BLr when the dummy memory cell 13 is not present. Therefore, it is made possible for the control circuit 16 to open the charge transfer circuit 12 sufficiently.

In the present embodiment, the node MINUS is at the voltage 402a when the memory cell 114 stores data "1" and at the voltage 402b when the memory cell 114 stores data "0". It is made possible to adjust the voltage 402a of the node MINUS so as to rise to the ground voltage when data "1" is read out. In contrast to this, when the dummy memory cell 13 is not present, the node MINUS is at the voltage 412a when the memory cell 114 stores data "1" and at the voltage 412b when the memory cell 114 stores data "0". In the present embodiment, it is possible to raise the voltage of the node MINUS at the time of readout compared to the case where the dummy memory cell 13 is not present.

At the time T6, the readout voltage (negative voltage) of the node MINUS is differentially amplified by the sense amplifier 112 shown in FIG. 7 after the level thereof is shifted to a positive voltage by the level shift circuit 20 shown in FIG. 3. Then, the logic value of the data stored in the memory cell 114 is read out. After this, like the case of a general ferroelectric memory, a restore operation is performed by which the polarized state of the memory cell 114 polarized and reversed by the read operation is returned to the original state.

In the present embodiment, when electric charges are read out from the memory cell 114 to the bit line BL in the readout operation by the dummy memory cell 13, the voltage of the bit line BL is raised excessively. Because of this, the ability of the control circuit 16 is increased and it is made possible to open the charge transfer circuit 12 sufficiently. As a result, like the first embodiment, it is possible to prevent the readout margin from reducing and erroneous operations of the semiconductor can be prevented.

As described above, in the first and second embodiments, the bit line BL connected to the memory cell 114 is connected to the charge accumulation circuit 19 via the charge transfer circuit 12. The memory cell 114 has the capacitors F1 and F2 for accumulating electric charges in accordance with the logic of the data. The control circuit 16 controls the charge transfer ability of the charge transfer circuit 12 in accordance with the change in the voltage of the bit line BL due to the read out electric charges in order to transfer the electric charges read out by the bit line BL to the charge accumulation circuit 19.

The memory cell 114 has the capacitors F1 and F2 for accumulating electric charges in accordance with the logic of the data. The charge transfer circuit 12 transfers the electric charges of the bit line BL to the output node MINUS. The dummy memory cell 13 is connected to the bit line BL. The control circuit 16 controls the charge transfer ability of the charge transfer circuit 12 in accordance with the change in the voltage of the bit line BL. The output node initialization circuit 19 initializes the voltage of the output node MINUS to a negative voltage. The charge transfer initialization circuit 18 initializes the charge transfer ability of the charge transfer circuit 12.

To the respective bit lines BLE and BLO, the dummy memory cell 13 is connected, respectively. The dummy memory cell 13 raises the bit line BL excessively when electric charges are read out from the memory cell 114 to the bit line BL. Due to this, the ability of the control circuit 16 is increased and it is made possible to open the charge transfer circuit 12 sufficiently. As a result, it is possible to prevent the readout margin from reducing when the data written into the memory cell 114 is read out and erroneous operations of the semiconductor memory can be prevented.

Third Embodiment

A semiconductor memory device according to a third embodiment of the present embodiment has the same configuration as that in FIG. 1 and FIG. 2 described above. The present embodiment differs from the first and second embodiments in the configuration of the pre-sense amplifier 113.

Figure 9:
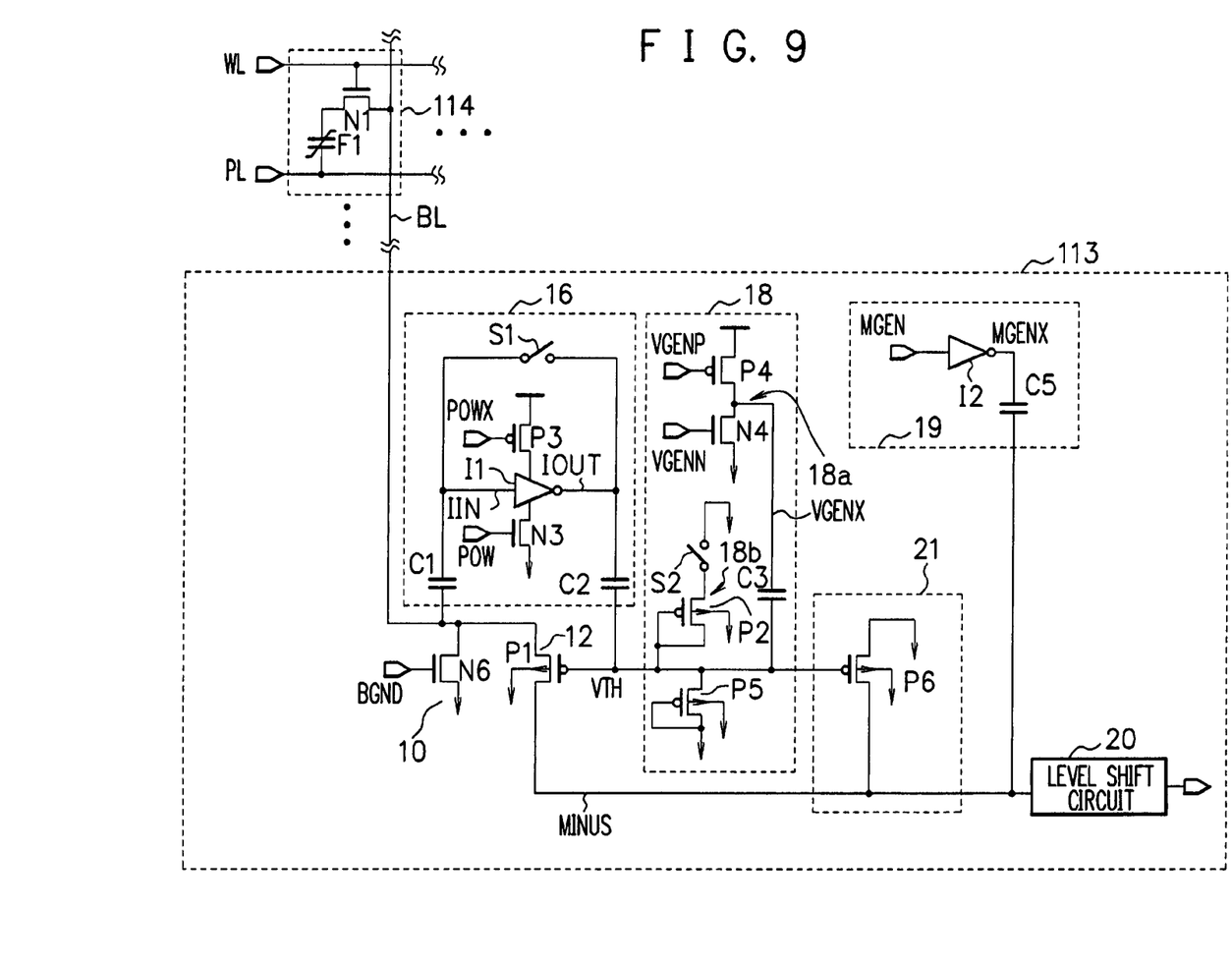
FIG. 9 is a circuit diagram showing details of a pre-sense amplifier according to a third embodiment of the present invention.

FIG. 9 shows the details of the pre-sense amplifier 113 shown in FIG. 1. The pre-sense amplifier 113 has the bit line initialization circuit 10, the charge transfer circuit 12, a current amplification circuit 21, the inverter amplifier (control circuit) 16, the threshold voltage generation circuit (initialization circuit) 18, the negative voltage generation circuit (charge accumulation circuit, initialization circuit) 19, and the level shift circuit 20. The present embodiment is an embodiment in which the dummy memory cell 13 is eliminated and the current amplification circuit 21 is added in the first embodiment (FIG. 3).

The bit line initialization circuit 10 is configured by the n channel transistor N6 the gate of which is connected to the line of a control signal BGND, the source of which is connected to the ground line, and the drain of which is connected to the bit line BL (BLE or BLO).

The charge transfer circuit 12 is configured by the p channel transistor P1 the gate (control terminal) of which is connected to the output node VTH of the threshold voltage generation circuit 18, the source of which is connected to the bit line BL, and the drain of which is connected to the output node MINUS of the negative voltage generation circuit 19.

The current amplification circuit 21 is configured by a p channel transistor P6 the gate of which is connected to the output node VTH of the threshold voltage generation circuit 18, the source of which is connected to the ground voltage, and the drain of which is connected to the output node MINUS of the negative voltage generation circuit 19.

The inverter amplifier 16 has the CMOS inverter (feedback inverter) I1, the switch S1 for connecting the output terminal IOUT of the CMOS inverter I1 with the input terminal IIN, the capacitor C1 arranged between the input terminal IIN of the CMOS inverter I1 and the bit line BL, and the capacitor C2 arranged between the output IOUT terminal of the CMOS inverter I1 and the gate of the charge transfer circuit 12. The source of the p channel transistor in the CMOS inverter I1 is connected to the drain of the p channel transistor P3. The gate of the p channel transistor P3 is connected to the line of the power control signal POWX and the source is connected to the power source line VDD. The source of the n channel transistor in the CMOS inverter I1 is connected to the drain of the n channel transistor. The gate of the n channel transistor N3 is connected to the line of the power control signal POW, and the source is connected to the ground line. The power control signals POWX and POW change to the low level and to the high level, respectively, when they start readout operation and activate the CMOS inverter I1. In the same manner, the switch S1 is turned off when readout operation is started. The capacitors C1 and C2 are configured by, for example, a ferroelectric capacitor.

The threshold voltage generation circuit 18 has the voltage generation circuit 18a for generating the high level (power source voltage VDD) or the low level (ground voltage) at a node VGENX, the capacitor C3 connected between the node VGENX and the node VTH, the clamp circuit 18b connected to the node VTH, and the switch S2 for connecting the clamp circuit 18b with the ground line. The voltage generation circuit 18a has the p channel transistor P4 and the n channel transistor N4 connected in series between the power source line VDD and the ground line. The gates of the p channel transistor P4 and the n channel transistor N4 input the voltage control signals VGENP and VGENN, respectively. The clamp circuit 18b is constituted by the p channel transistor P2 the source of which is connected to the ground line via the switch S2 and the gate and the drain of which are connected to the node VTH, and the p channel transistor P5 the gate and drain of which are connected to the ground line and the drain of which is connected to the node VTH. The capacitor C3 is configured by, for example, a ferroelectric capacitor.

The negative voltage generation circuit 19 has the CMOS inverter I2 the input of which is connected to the line of the negative voltage control signal MGEN and the output of which is connected to the node MGENX and the capacitor C5 arranged between the node MGENX and the node MINUS. The capacitor C5 is configured by, for example, a ferroelectric capacitor.

The level shift circuit 20 has a capacitor for shifting in level the negative voltage generated at the node MINUS to a positive voltage, an n channel transistor, and a p channel transistor.

Figure 10:
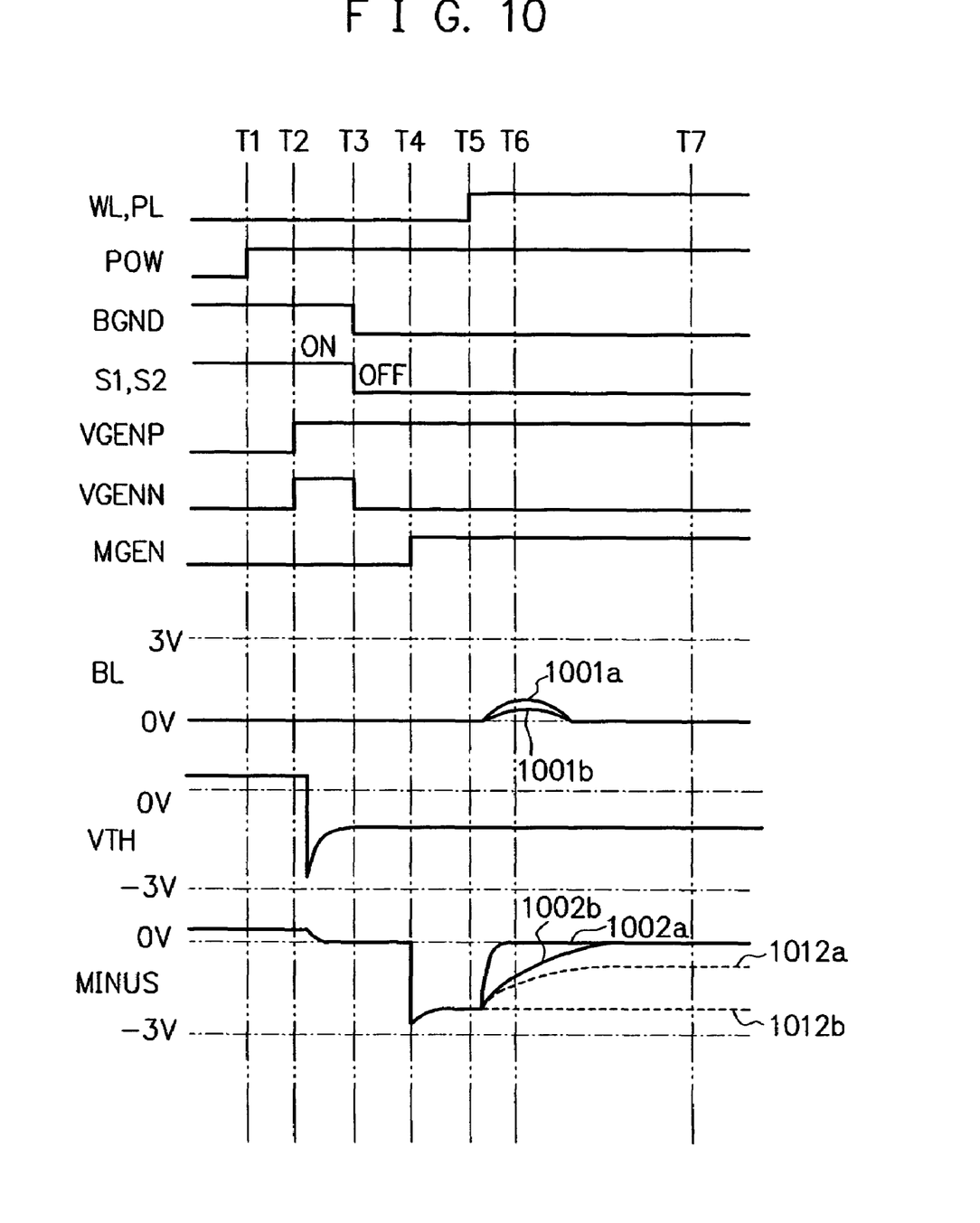
FIG. 10 is a waveform diagram showing a readout operation of a ferroelectric memory according to the third embodiment.

FIG. 10 shows readout operation of a ferroelectric memory according to the third embodiment. First, in the initial state, the node MINUS connected to the drain of the p channel transistor (charge transfer circuit) 12 is in a floating state, therefore, its voltage is not determined. However, a pn junction is formed by the source and drain (p type diffusion layer) of the p channel transistor 12 and the back gate (n type diffusion layer, ground voltage), therefore, the voltage of the node MINUS does not rise above the forward voltage (about 0.8 V) of the pn junction. On the other hand, the node VTH connected to the gate of the p channel transistor (charge transfer circuit) 12 is also in a floating state, therefore, its voltage is not determined. However, due to the p channel transistor P5 arranged in the clamp circuit 18b, the voltage of the node VTH does not rise above the threshold voltage (about 0.6 V) of the p channel transistor.

The voltage control signals VGENP and VGENN, and the negative voltage control signal MGEN are kept at the low level and the nodes VGENX and MGENX are kept at the high level. Since the control signal BGND is kept at the high level, the n channel transistor N6 (bit line initialization circuit 10) turns on and the voltage of the bit line BL (BLE or BLO) is initialized to the ground voltage. The power control signals POW and POWX are kept at the low level and at the high level, respectively, and the feedback inverter (CMOS inverter) I1 is turned off. The switches S1 and S2 are turned on. The control signal for controlling the operation of the switches S1 and S2, the voltage control signals VGENP and VGENN, the negative voltage control signal MGEN, the control signal BGND, and the power control signals POW and POWX are generated by the timing generation circuit 104 shown in FIG. 1.

At the time T1, the power control signals POW and POWX change to the high level and to the low level, respectively, and the feedback inverter I1 is activated. Since the switch S1 is turned on, the input voltage IIN and the output voltage IOUT of the feedback inverter I1 are both approximately VDD/2.

At the time T2, the voltage control signals VGENP and VGENN change to the high level and the node VGENX changes from the high level to the low level. Due to the capacitive coupling of the capacitor C3, the voltage of the node VTH drops in accordance with the change of the node VGENX to the low level. When the power source voltage VDD is 3 V, if the voltage node VGENX drops by 3 V, the voltage of the VTH also tends to drop by 3 V. However, when the switch S2 turns on, the p channel transistor (clamp circuit) 18b clamps the voltage of the node VTH at the threshold voltage (for example, −0.6 V) of the p channel transistor 18b. Because of this, the voltage of the node VTH draws a differential waveform and settles at a negative voltage (−0.6 V) after rising once. As described above, the threshold voltage generation circuit 18 operates as an initialization circuit for setting the input node VTH of the charge transfer circuit 12 to a predetermined voltage.

The threshold voltage of the p channel transistor 12 is designed so as to be equal to the threshold voltage of the p channel transistor 18b. Therefore, when the voltage of the node VTH drops once, the p channel transistor 12 turns on and the voltage of the node MINUS drops to the voltage (ground voltage) of the bit line BL.

On the other hand, the voltage of the node MGENX is set to the high level (=power source voltage VDD) by the CMOS inverter 12, therefore, the capacitor C5 is charged with electric charges corresponding to the product the capacitance value and the power source voltage VDD.

At the time T3, the voltage control signal VGENN changes to the low level and the n channel transistor N4 of the voltage generation circuit 18a turns off. Since the p channel transistor P4 of the voltage generation circuit 18a has already turned off, the node VGENX enters a floating state. At the same time, the switches S1 and S2 are turned off. By the turning off of the switch S2, the clamp of the node VTH by the p channel transistor 18b is released. By the turning off of the switch S1, the short circuit between the input and output of the feedback inverter I1 is released. The voltage of the input of the feedback inverter I1 is approximately VDD/2, therefore, the feedback inverter I1 operates as an inversion amplifier having a high gain. On the other hand, the control signal BGND also changes to the low level and the bit line BL enters a floating state. Because of the operations described above, after the time T3, when the voltage of the bit line BL rises, the input voltage IIN of the feedback inverter I1 rises due to the capacitive coupling of the capacitor C1. The feedback inverter I1 amplifies the change in the input voltage IIN and lowers the output voltage IOUT in the opposite direction. The voltage of the node VTH drops in accordance with the change in the output voltage IOUT due to the capacitive coupling of the capacitor C2.

At the time T4, the negative voltage control signal MGEN changes to the high level and the voltage of the node MGENX changes from the high level to the low level. The voltage of the node MINUS drops in accordance with the drop in the voltage of the node MGENX due to the capacitive coupling of the capacitor C5. When the power source voltage VDD is 3 V, the voltage of the node MGENX drops by 3 V. Since the voltage of the node MINUS is initialized to 0 V, it drops to about −3 V due to the change in the voltage of the node MGENX. However, due to the loss by the parasitic capacitance and the leak current of the p channel transistor 12 already slightly conductive, the voltage of the node MINUS becomes higher than −3 V.

The voltage of the node MINUS is kept at the voltage by the capacitor C5. In this manner, the negative voltage generation circuit 19 operates as an initialization circuit for setting the output node MINUS of the charge transfer circuit 12 to its initial state and the charge transfer ability of the charge transfer circuit 12 to its initial state.

At the time T5, the voltages of the word line WL and the plate line PL change from the ground voltage to the power source voltage VDD. By the rise of the word line WL, the access transistor N1 of the memory cell 114 turns on and a positive voltage is applied to the ferroelectric capacitor F1 of the memory cell 114. When the memory cell 114 stores data "1", the polarity of the voltage applied to the ferroelectric capacitor F1 is opposite to that at the time of write, therefore, polarities are reversed and a large amount of reversed electric charges are read out to the bit line BL. In the bit line BL, a voltage 1001a with data "1" is generated. When the memory cell 114 stores data "0", the polarity of the voltage applied to the ferroelectric capacitor F1 is the same as that at the time of write, therefore, polarities are not reversed and a comparatively small amount of electric charges are read out to the bit line BL. In the bit line BL, a voltage 1001b with data "0" is generated. At this time, the voltage of the bit line BL tends to rise.

However, if the voltage of the bit line BL rises slightly, due to the capacitive coupling of the capacitor C1, the input voltage IIN of the feedback inverter I1 rises. Due to the inversion amplification effect and the capacitive coupling of the capacitor C2, the voltage of the node VTH drops and the voltage (absolute value) between gate and source of the p channel transistor 12 becomes large. Because of this, a drain current occurs in the p channel transistor 12 and the electric charges read out to the bit line BL are transferred from the bit line BL to the node MINUS. Therefore, the rise in the voltage of the bit line BL is suppressed and kept again at about 0 V (ground voltage). In this manner, the feedback inverter I1 operates as a control circuit for adjusting the charge transfer ability of the charge transfer circuit 12. The capacitor C5 is caused to discharge due to the electric charges transferred to the node MINUS, the voltage (readout voltage) of the node MINUS rises. In this manner, the capacitor C5 of the negative voltage generation circuit 19 operates as a readout circuit for generating a readout voltage in accordance with the accumulated electric charges.

In the bit line GND sense system, it is possible to fully apply the power source voltage VDD to the bit line BL without being affected by the capacitance division of the bit line BL and the memory cell 114, however, as described above, the control circuit 16 operates in such a way as to detect a slight rise of the bit line BL at the time of readout operation and open the gate of the charge transfer circuit 12 to cause the electric charges to flow, thereby the bit line BL returns to the ground again. The memory makes judgment by amplifying the difference between the voltage due to the electric charges that come out when data "1" is read out (P term) and the voltage due to the electric charges that come out when data "0" is read out (U term) by the sense amplifier 112. However, miniaturization advances and the memory cell 114 is reduced in size, not only the amount of polarized electric charges Qsw(P−U) but also the respective amounts of P term and U term become smaller, therefore, the ratio in which electric charges are absorbed in a parasitic capacity in the circuit increases and the peak to which the bit line rises is reduced considerably. Due to this, the control circuit 16 is put into a state of being unable to open the charge transfer circuit 12 sufficiently and the readout margin is thus reduced.

In the present embodiment, to the charge transfer circuit 12, the current amplification circuit 21 is connected and during the readout operation, when the feedback inverter of the control circuit 16 detects a rise of the bit line BL and pushes down the node VTH, the node MINUS enters a state in which a current is supplied at all times from the ground voltage. Due to this, the ability of the charge transfer circuit 12 is increased and even if the amount of electric charges read out to the bit line BL is small, it is possible to sufficiently discharge the electric charges in the charge accumulation circuit 19.

In the present embodiment, the node MINUS is at a voltage 1002a when the memory cell 114 stores data "1" and at a voltage 1002b when the memory cell 114 stores data "0". It is made possible to adjust the voltage 1002a of the node MINUS so as to rise to the ground voltage when data "1" is read out. In contrast to this, when the current amplification circuit 21 is not present, the node MINUS is at a voltage 1012a when the memory cell 114 stores data "1" and at a voltage 1012b when the memory cell 114 stores data "0". In the present embodiment, it is possible to raise the voltage of the node MINUS at the time of readout compared to the case where the current amplification circuit 21 is not present.

In the present embodiment, like the first embodiment described with reference to FIG. 6, if the voltage 1002a when data "1" is read out (P term) is adjusted so that it rises to the ground voltage, the variations of the distribution 601a of P term are suppressed apparently, the distribution becomes steeper, and the sense margin can be widened.

At the time T6, the readout voltage (negative voltage) of the node MINUS is differentially amplified by the sense amplifier 112 shown in FIG. 1 after the level thereof is shifted to a positive voltage by the level shift circuit 20 shown in FIG. 9. Then, the logic value of the data stored in the memory cell 114 is read out. After this, like the case of a general ferroelectric memory, a restore operation is performed by which the polarized state of the memory cell 114 polarized and reversed by the read operation is returned to the original state.

When the current amplification circuit 21 is not present, the voltages 1012a and 1012b of the node MINUS rise slowly, therefore, at later time T7, the sense amplifier 112 performs differential amplification and data is outputted to the outside. In contrast to this, in the present embodiment, the voltages 1002a and 1002b rise quickly, therefore, at the earlier time T6, the sense amplifier performs differential amplification and the data is outputted to the outside. In other words, in the present embodiment, it is possible to perform the readout operation at high speed and to output data to the outside compared to the case where the current amplification circuit 21 is not present.

As described above, in the present embodiment, to the charge transfer circuit 12, the current amplification circuit 21 is connected and during the readout operation, a current is supplied from the ground voltage at all times. Due to this, the ability of the charge transfer circuit 12 is increased and even if the amount of electric charges read out to the bit line BL is small, it is possible to sufficiently discharge the electric charges in the charge accumulation circuit 19. As a result, it is possible to prevent the readout margin from reducing and erroneous operations of the semiconductor memory can be prevented.

In the present embodiment, the bit line BL connected to the memory cell 114 is connected to the charge accumulation circuit 19 via the charge transfer circuit 12. The memory cell 114 has the capacitors F1 and F2 for accumulating electric charges in accordance with the logic of the data. The control circuit 16 controls the charge transfer ability of the charge transfer circuit 12 in accordance with the change in the voltage of the bit line BL due to the read out electric charges in order to transfer the electric charges read out by the bit line BL to the charge accumulation circuit 19.

The memory cell 114 has the capacitors F1 and F2 for accumulating electric charges in accordance with the logic of the data. The charge transfer circuit 12 transfers the electric charges of the bit line BL to the output node MINUS. The current supply circuit 21 supplies a current from the ground voltage to the output node MINUS. The control circuit 16 controls the charge transfer ability of the charge transfer circuit 12 and the current supply circuit 21 in accordance with the change in the voltage of the bit line BL. The output node initialization circuit 19 initializes the voltage of the output node MINUS to a negative voltage. The charge transfer initialization circuit initializes the charge transfer ability of the charge transfer circuit 12 and the current supply circuit 21.

To the charge transfer circuit 12, the current amplification circuit 21 is connected and during the readout operation, a current is supplied from the ground voltage at all times. Due to this, the ability of the charge transfer circuit 12 is increased and even if the amount of electric charges read out to the bit line BL is small, it is possible to sufficiently discharge the electric charges in the charge accumulation circuit 19. As a result, it is possible to prevent the readout margin from reducing when the data written into the memory cell is read out and erroneous operations of the semiconductor memory can be prevented. Further, as the voltage rise rate of the node MINUS at the time of readout is large, therefore, it is possible to perform a high-speed readout operation.

It is possible to prevent the readout margin from reducing when data written into the memory cell is read out.

By the way, the above embodiments merely show embodied examples when the present invention is performed and should not be interpreted as those to limit the technical scope of the present invention. In other words, the present invention can be performed in various ways without departing from the technical spirit and the main features.

What is claimed is:

1. A memory device comprising:
   a memory cell having a capacitor to accumulate electric charges in accordance with logic of data;
   a bit line connected to said memory cell;
   a charge transfer circuit to transfer the electric charges of said bit line to an output node;
   a dummy memory cell to store fixed data and connected to said bit line; and
   a control circuit to control the charge transfer ability of said charge transfer circuit in accordance with a change in the voltage of said bit line.

2. The memory device according to claim 1, wherein said dummy memory cell has a capacitor connected to said bit line via a transistor.

3. The memory device according to claim 2, wherein said memory cell and said dummy memory cell have a ferroelectric capacitor.

4. The memory device according to claim 1, wherein said dummy memory cell has a capacitor connected to said bit line.

5. The memory device according to claim 1, further comprising an output node initialization circuit to initialize the voltage of said output node and a charge transfer initialization circuit to initialize the charge transfer ability of said charge transfer circuit.

6. The memory device according to claim 5, wherein said output node initialization circuit initializes said output node to a negative voltage.

7. The memory device according to claim 6, further comprising a level shift circuit to shift in level the voltage of said output node.

8. The memory device according to claim 5, wherein:
   said charge transfer circuit has a first field effect transistor connected between said bit line and said output node;

said control circuit has a first inverter the input of which is connected to said bit line via a first capacitor and the output of which is connected to the gate of said first field effect transistor via a second capacitor;

said output node initialization circuit has a second inverter connected to said output node via a third capacitor; and said charge transfer initialization circuit has a fourth capacitor connected to the gate of said first field effect transistor, a second field effect transistor connected between said fourth capacitor and the high level voltage, and a third field effect transistor connected between said fourth capacitor and the ground voltage.

9. The memory device according to claim 1, wherein:

said charge transfer circuit has a first field effect transistor connected between said bit line and said output node; and said control circuit has a first inverter the input of which is connected to said bit line via a first capacitor and the output of which is connected to the gate of said first field effect transistor via a second capacitor.

10. The memory device according to claim 1, wherein said memory cell has a ferroelectric capacitor.

11. A memory device comprising:

a memory cell having a capacitor to accumulate electric charges in accordance with logic of data;

a bit line connected to said memory cell;

a charge transfer circuit to transfer the electric charges of said bit line to an output node;

a current supply circuit to supply a current from the ground voltage to said output node by connecting between said output node and a node of the around voltage; and a control circuit to control the charge transfer ability of said charge transfer circuit in accordance with a change in the voltage of said bit line.

12. The memory device according to claim 11, wherein said control circuit controls the charge transfer ability of said charge transfer circuit and said current supply circuit in accordance with the change in the voltage of said bit line.

13. The memory device according to claim 12, further comprising:

an output node initialization circuit to initialize the voltage of said output node; and a charge transfer initialization circuit to initialize the charge transfer ability of said charge transfer circuit and said current supply circuit.

14. The memory device according to claim 13, wherein said output node initialization circuit initializes said output node to a negative voltage.

15. The memory device according to claim 14, further comprising a level shift circuit to shift in level the voltage of said output node.

16. The memory device according to claim 13, wherein:

said charge transfer circuit has a first field effect transistor connected between said bit line and said output node;

said control circuit has a first inverter the input of which is connected to said bit line via a first capacitor and the output of which is connected to the gate of said first field effect transistor via a second capacitor;

said output node initialization circuit has a second inverter connected to said output node via a third capacitor;

said charge transfer initialization circuit has a fourth capacitor connected to the gate of said first field effect transistor, a second field effect transistor connected between said fourth capacitor and the high level voltage, and a third field effect transistor connected between said fourth capacitor and the ground voltage; and said current supply circuit has a fourth field effect transistor the source and drain of which are connected to the ground voltage and said output node, and the gate of which is connected to the gate of said first field effect transistor.

17. The memory device according to claim 11, wherein:

said charge transfer circuit has a first field effect transistor connected between said bit line and said output node;

said control circuit has a first inverter the input of which is connected to said bit line via a first capacitor and the output of which is connected to the gate of said first field effect transistor via a second capacitor; and said current supply circuit has a second field effect transistor the source and drain of which are connected to the ground voltage and said output node, and the gate of which is connected to the gate of said first field effect transistor.

18. The memory device according to claim 11, wherein said memory cell has a ferroelectric capacitor.

* * * * *